United States Patent [19]

Doi

[11] 4,155,059
[45] May 15, 1979

[54] CIRCUIT NETWORK SHOWING PROPER EQUIVALENT IMPEDANCE BETWEEN TWO NETWORK TERMINALS

[76] Inventor: Nobuo Doi, Kanan-Cho, Daigatsuka 60, Osaka, Japan, 585

[21] Appl. No.: 806,461

[22] Filed: Jun. 14, 1977

[51] Int. Cl.² .......................................... H03H 11/00
[52] U.S. Cl. .................................. 333/214; 307/230; 330/109
[58] Field of Search ......................... 333/80 R, 80 T; 330/107, 109; 328/127; 307/230

[56] References Cited

U.S. PATENT DOCUMENTS

| | | | |
|---|---|---|---|
| 3,539,826 | 11/1970 | Crouse | 333/80 T X |
| 3,736,517 | 5/1973 | Lim | 333/80 R X |
| 4,025,867 | 5/1977 | Seidel | 330/109 X |

Primary Examiner—Paul L. Gensler

[57] ABSTRACT

A circuit network with a pair of operational amplifiers and impedance elements, to show equivalent impedance, between two network terminals, of a value either well reduced or enlarged from the impedance of the impedance elements. The network may thus function as idealized diode when the impedance elements are diodes, or may be of large equivalent capacitance or inductance, as the impedance elements are capacitors or inductors.

14 Claims, 10 Drawing Figures

CIRCUIT NETWORK SHOWING PROPER EQUIVALENT IMPEDANCE BETWEEN TWO NETWORK TERMINALS

BRIEF SUMMARY OF THE INVENTION

This invention relates to a circuit network which may freely be inserted in between any two terminals in any electrical circuit, just in the same way as if it were a simple 2-terminal circuit element, showing low (or high, as the case may be,) equivalent impedance between the two network terminals, using readily available circuit elements.

One object of this invention is thus to provide a circuit network to function as an idealized diode, namely a diode with forward resistance and threshold voltage both far less than those of the simple diodes used as the network elements.

Another object of this invention is to provide a circuit network to function as a capacitor of the capacitance far greater than that of the simple capacitors used as the network elements.

Still another object of this invention is to provide a circuit network to function as an inductor of the inductance far greater than that of the simple inductors used as the network elements.

DETAILED DESCRIPTION

With the development of the semiconductor technology, various circuit elements have been available in solid state and minimized in size. However, it is still difficult to obtain diodes with very low forward resistance and threshold voltage, and it is also difficult to obtain in solid state, or to minimize in size, capacitors of large capacitance or inductors of large inductance.

On the other hand, amplifiers of excellent quality can now be readily obtained in very reduced size and less expensively as a result of the remarkable development in the technique of circuit integration and modularization, and various efforts have thus been made in making up circuits incorporating proper operational amplifiers to obtain reduced equivalent impedance, for use when the voltage between the circuit terminals is small.

Figure 1:
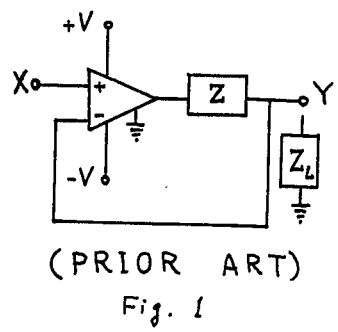
FIG. 1 is a block diagram of a conventional circuit intended to obtain reduced equivalent impedance.

Fundamental concept of such conventional circuits may be clear from FIG. 1 as given just for this purpose, in which the circuit terminals are shown at X and Y and there is provided therebetween a series connection of a differential amplifier, powered by DC sources $+V$ and $-V$, and an element with impedance in the value of Z, with non-inverting input terminal of the amplifier connected to one circuit terminal X and with inverting input terminal thereof connected, together with end terminal of the impedance element, to the other circuit terminal Y. Expressing hereinafter potential of any point as v suffixed with the symbol of the point, and supposing that the circuit terminal Y is grounded via a load impedance $Z_L$ and input portion of the amplifier is of sufficiently high input impedance for instance as in the case of FET (field effect transistor), thus with negligible input current; then the output current is expressed as:

$$G(v_X - v_Y)/(Z + Z_L)$$

with G denoting the amplification ratio of the amplifier as is actually working,
and so the equivalent impedance between the two circuit terminals X and Y, when defined as $$(v_X - v_Y)/\text{output current,}$$

is obtained as:

$$(Z + Z_L/G) \tag{1}$$

Therefore, it is known that fairly reduced equivalent impedance is obtained by use of the amplifier with very large amplification ratio G, so long as the terminal potential difference $v_X - v_Y$ is within the active functioning range of the amplifier. Particularly, when the impedance element is a diode, then such circuit is conventionally known and used as "idealized diode."

In such conventional circuit, however, it should be noted that the value of the equivalent impedance is dependent on the value of the load impedance $Z_L$, as is known from expression (1) supra, and moreover that the circuit is rather of anomalous nature in that the load current passes through the circuit output terminal Y all right but never through the circuit input terminal X, in fact the current being supplied sideways from the DC sources $+V$, $-V$. Such has thus only a limited range of practical use as a 2-terminal equivalent impedance circuit.

Principal object of the present invention is to eliminate the drawbacks of the conventional circuit and to provide a novel circuit network in which the load current passes through both the input and output terminals just as in the case of a simple 2-terminal circuit element and which can therefore quite freely be inserted in between any two terminals in any electrical circuit, furthermore in fact with the feature that the equivalent impedance has the value independent of the load impedance.

Figure 2:
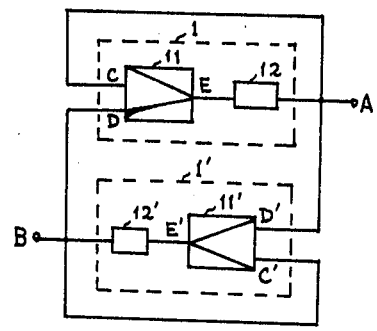
FIG. 2 is a block diagram of a fundamental circuit network according to this invention.

To attain the object, the network according to this invention, as illustrated in FIG. 2, is characterized by the provision of the following constituent elements (i) and (ii):

(i) a first operational circuit 1, comprising:
  (a) a first operational amplifier 11 having high input impedance, with a first input terminal C linked to the first network terminal A and with a second input terminal D linked to the second network terminal B, with input potentials expressed as $V_C$ and $V_D$, respectively, then to develop an output potential of:

$$V_E = V_C - G(V_C - V_D)$$

with G indicating the operational amplification ratio
on an output terminal E, and
(b) a first impedance element 12, with one end connected to the output terminal E of the first operational amplifier 11 and with the other end connected to the first network termial A, and
(ii) a second operational circuit 1', comprising:
(c) a second operational amplifier 11' having high input impedance, with a first input terminal C' linked to the second network terminal B and with a second input terminal D' linked to the first network terminal A, with input potentials expressed as $V_C'$ and $V_D'$, respectively, then to develop an output potential of:

$$V_E' = V_C' - G'(V_C' - V_D')$$

with G' indicating the operational amplification ratio
on an output terminal E', and
(d) a second impedance element 12', with one end connected to the output terminal E' of the second operational amplifier 11' and with the other end connected to the second network terminal B, having such impedance value that the ratio of the value to the said amplification ratio G' substantially equals the ratio of impedance value of the first impedance element 12 to the amplication ratio G of the first operational amplifier 11.

With this construction, the equivalent impedance between the network terminals A and B has the value $Z_o$ as expressed as:

$$Z_o = Z/G = Z'/G'$$

with Z and Z' denoting the values of the first and the Second impedance elements, respectively, which is entirely independent of what external loads are connected to the network terminals A,B. Thus the current in the value of $(V_A - V_B)/Z_o$ with consideration also of the positive or negative sign thereof flows into the network through the terminal A and the same current flows out through the terminal B. The object as intended has thus been fully attained. Practically, it will of course be preferable to use the first and the second operational circuits in identical construction with each other, thus satisfying G=G' and Z=Z'.

How to practically construct the first and the second operational amplifiers 11, 11' is of no problem to those skilled in the art, and there may be various types of them as may be adopted.

Figure 3:
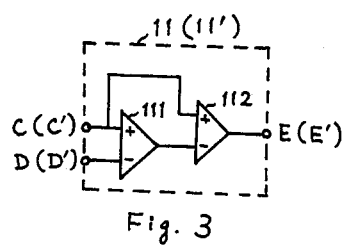
FIGS. 3, 4 and 5 are block diagrams of the different types of construction of the operation amplifiers used in the circuit network of FIG. 2.

One of the preferred embodiments is shown by way of example in FIG. 3, as comprises:
(i) a first differential amplifier 111 of amplification ratio G,G', with terminals of:
(a) non-inverting input terminal connected to the first input terminal C,C' of the operational amplifier 11,11',
(b) inverting input terminal connected to the second input terminal D,D' of the operational amplifier 11,11', and
(c) output terminal, and
(ii) a second differential amplifier 112 of amplification ratio unity, namely a simple subtractor, with terminals of:
(d) non inverting input terminal connected to the positive input terminal of the first differential amplifier 111,
(e) inverting input terminal connected to the output terminal of the first differential amplifier 111, and
(f) output terminal connected to the output terminal E,E' of the operational amplifier 11,11'.

Figure 4:
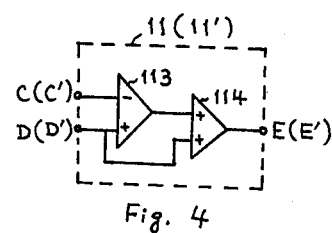

Another possibility of the preferred embodiments of the first and the second operational amplifiers 11,11', as shown in FIG. 4, comprises:
(i) a differential amplifier 113 of amplification ratio "G-1,""G'-1," (negative value to be understood as inverting the non-inverting and inverting input terminals hereof as recited below in this description of FIG. 4) with terminals of:
(a) inverting input terminal connected to the first input terminal C,C' of the operational amplifier 11,11',
(b) non-inverting input terminal connected to the second input terminal D,D' of the operational amplifier 11,11', and
(c) output terminal, and
(ii) a simple adder 114 of amplification ratio unity, thus with identical input and output phases, with terminals of:
(d) a first input terminal connected to the non-inverting input terminal of the differential amplifier 113,
(e) a second input terminal connected to the output terminal of the differential amplifier 113, and
(f) output terminal connected to the output terminal E,E' of the operational amplifier 11,11'.

Figure 5:
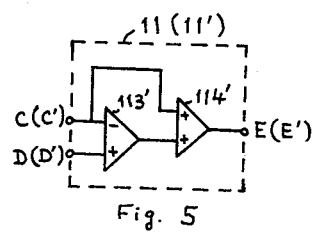

Instead of the construction in which the first input terminal of the adder 114 is connected to the non-inverting input terminal of the differential amplifier 113 as recited in item (d) supra, a modified construction of the operational amplifier 11,11' each in which the former terminal is connected to the inverting input terminal of the differential amplifier 113 is also possible, as shown in FIG. 5 where both of the original reference numerals 113 and 114 are now modified by adding a prime each as 113' and 114', but the differential amplifier 113' in FIG. 5 must have the amplification ratio G,G', while the differential amplifier 113 in FIG. 4 is supposed to have the smaller amplification ratio "G-1,""G'-1," thus the construction of FIG. 4 makes better or more effective use of the amplifier.

If high value of the equivalent impedance $Z_o$ is desired, then the operational amplification ratio G,G' as defined in this invention as above should have the value less than unity, and it will generally be all right to construct the operational amplifiers 11,11' in such case using for instance multiple-stage follower type amplifier with bleeder resistors interposed in between the stages for stepping down the voltage.

When the operational amplification ratio G,G' of every operational amplifier 11,11' is of large value, no matter in which construction of FIG. 2, 3, 4 or 5 and if every impedance element 12,12' is a diode, it is clear that this circuit network functions as an idealized diode with the equivalent forward resistance and threshold voltage both of minimized value. In this instance, care should be paid that the first and the second diodes 12,12' are both arranged in polarity in a same direction with respect to the two network terminals A,B.

With the network of FIG. 2 constructed as such an idealized diode, suppose an instance where the input polarity between the network terminals A,B becomes to be in reverse potential direction with respect to the diodes 12,12'.

Figure 8:
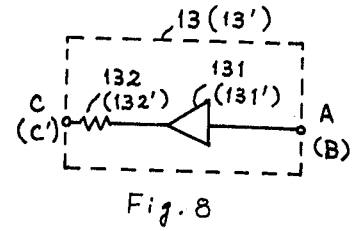
FIG. 8 is a block diagram of a preferred embodiment of the constituent elements used in the circuit network of FIG. 6 or 7.

The diodes 12,12' put in such reverse polarity potential state can not retain the operational amplifiers 11,11' functioning in proper negative feedback manner, and therefore the potential difference between the network terminals A and B becomes too high to keep the operational amplifiers 11,11' to be properly retained within the active functioning region, thus to skip to the inactive region. When the input polarity next flips over and becomes to be in forward potential direction for the diodes 12,12', then some response time is required for the diodes 12,12' to be back again in the active functioning region, thus resulting in failure to properly follow the input with sudden, frequent changing-over. In order to eliminate such drawback and to retain the first and the second operational amplifiers 11,11' always in active functioning region no matter in which direction the network input is, the active-functioning-region-retaining circuit known per se according to Japanese Utility Model Application Publication SHO.52-11463 may be incorporated to make up the construction as shown in FIG. 8, wherein means for linking the first input terminal C of the first operational amplifier 11 to the first network terminal A comprises an interposed first linking element 13 of proper resistance value rather than a simple connecting wire, and an additional diode 14 is provided to bridge between the first input terminal C and output terminal E both of the first operational amplifier 11. This diode 14 is disposed in such polarity to face to the output terminal D of the first operational amplifier 11 a terminal which is opposite to terminal of the first diode 12 as connected to the output terminal E of the first operational amplifier 11. As for the side of the second operational amplifier 11' the situation is just same, thus second linking element 13' is interposed between the first input terminal C' of the second operational amplifier 11' and the second network terminal B, and another additional diode 14' is provided to bridge between the first input terminal C' and output terminal E' both of the second operational amplifier 11', as disposed in such polarity to face to the output terminal E' of the second operational amplifier 11' a terminal which is opposite to terminal of the second diode 12' as connected to the output terminal E' of the second operational amplifier 11'.

Figure 6:
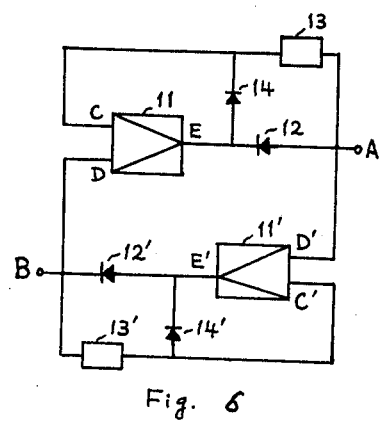
FIGS. 6 and 7 are block diagrams of different preferred embodiments, respectively, of the circuit network according to this invention, to function as idealized diodes.
Figure 9:
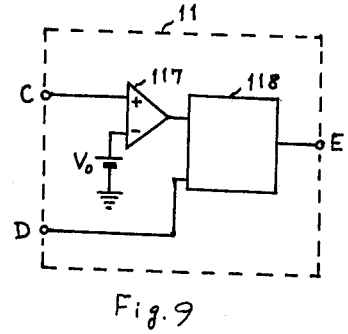
FIG. 9 is a block diagram of the operation amplifiers as may preferably be used in the circuit network of FIG. 6 or 7 incorporating the elements shown in FIG. 8.

Shown in FIG. 6 is the case where the forward direction is from the first network terminal A to the second terminal B, and in the case of the opposite direction all the diodes 12, 12',14,14' are arranged opposite to those illustrated.

Figure 7:
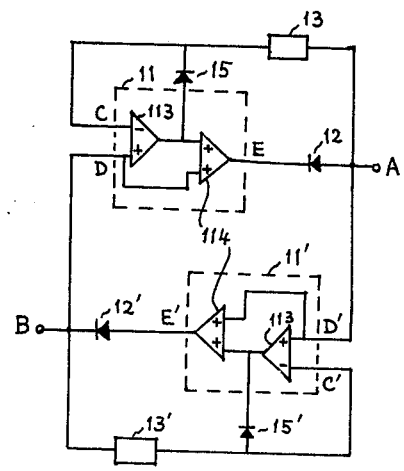

By the way, if the operational amplifiers 11,11' are constructed as shown in FIG. 4, then it is as well possible to somewhat alter how to incorporate the said active-functioning-region-retaining circuit, thus to make up the construction as seen in FIG. 7, wherein means for linking the first input terminal C of the first operational amplifier 11 to the first network terminal A comprises an interposed first linking element 13 of proper resistance value rather than a simple connecting wire, just similarly as in the case of FIG. 6, and an additional diode 15 is provided to bridge between the inverting input terminal and output terminal both of the differential amplifier 113 constituting the first operational amplifier 11, as disposed in such polarity to face to the output terminal of the differential amplifier 113 a terminal which is opposite to terminal of the first diode 12 as connected to the output terminal E of the first operational amplifier 11. As for the side of the second operational amplifier 11' the situation is just the same, thus a second linking element 13' is interposed between the first input terminal C' of the second operational amplifier 11' and the second network terminal B, and another additional diode 15' is provided to bridge between the inverting input terminal and output terminal both of the differential amplifier 113 constituting the second operational amplifier 11', as disposed in such polarity to face to the output terminal of the differential amplifier 113 a terminal which is opposite to terminal of the second diode 12' as connected to the output terminal E' of the second operational amplifier 11'.

Shown in FIG. 7 is the case of the polarity just the same as shown in FIG. 6. It is clear without any further explanation that the incorporation of the additional diodes 15,15' same as in FIG. 7 is possible also in the case where the operational amplifiers 11,11' are constructed as shown in FIG. 5.

Simplest construction of the linking elements 13,13' shown either in FIG. 6 or 7 is a resistor as taught in said Japanese Utility Model Application Publication SHO.52-11463.

With the interposition of such resistance, the first input terminals C,C' of the respective operational amplifiers 11,11' are made immune from any high reverse input voltage in between the two network terminals A,B, and subjected to amplifier output voltage feedback in negative feedback manner by means of the respective additional diodes 15,15', thus the input voltage relative to the respective second input terminals D,D' is kept small, resulting in properly remaining in the active functioning region.

It should be noted, however, that under such reverse direction potential the diodes 12,12' are by-passed respectively by the series connection of the additional diodes 15,15' in conducting state and the linking elements 13,13', thus to lower the reverse direction insulating resistance of this idealized diode network, which is objectionable in some specific purpose of the utilization. How to construct the linking elements 13,13' per se in order to prevent such lowering of the reverse direction insulating resistance has already been taught by the same inventor in Japanese Utility Model Application SHO.52-41217, as comprising each, as shown in FIG. 8, series connection of a follower-type amplifier 131,131', of high input impedance, and a resistor 132,132'.

It should be noted, however, that in case each of the follower-type amplifiers 131,131' is made for instance of one FET only, with no sufficient amplification ratio when used as normal type amplifier rather than a follower, the amplification ratio as the follower amplifier is considerably less than unity and moreover there normally is seen a discrepancy between the zero points of the input and output, and it is necessary to somewhat modify the operational mode of the respective operational amplifiers 11,11', in order to obtain even in such case the equivalent network impedance as is yet entirely independent of the external load.

Suppose here the functional relationship between the input and output potentials $V_{in}$ and $V_{out}$, respectively, of the follower-type amplifier 131 is:

$$V_{out} = g \cdot V_{in} + V_o$$

with g indicating the amplification ratio and $V_o$ the zero point discrepancy,
then the operational mode as required for the operational amplifier 11 in order to obtain the equivalent impedance between the network terminals A,B as is entirely independent of the external load, is expressed as:

$$V_E = (V_C - V_o/g) - G[(V_C - V_o/g) - V_D]$$

and a practical mode how to construct such operational amplifier 9 is shown by way of example in FIG. 11, wherein: a differential amplifier 117, with non-inverting input terminal thereof connected to the first input terminal C of the amplifier 11 and with inverting input terminal thereof connected to zero point discrepancy compensating potential $V_o$, has an amplification ratio equal to 1/g; and a 3-terminal circuitry 118 having two input- and one output-terminals, with one input terminal connected to output terminal of the differential amplifier 117, with the other input terminal connected to the second input terminal D of the amplifier 11, and with the sole output terminal connected to the output terminal E of the amplifier 11, may be of any construction as shown in FIG. 3, 4 or 5.

As another field of practical application of this invention, it is clear that this network will function as a capacitor of large equivalent capacitance, when the operational amplification ratio G,G' of every operational amplifier 11,11' is of large value, no matter in which construction of FIG. 2, 3, 4, or 5, and if every impedance element 12,12' is a capacitor.

It should be noted, however, when use is intended as a capacitor to function for AC current showing small voltage between the two network terminals A,B, as is overlapped on to a far larger DC voltage kept therebetween, that the operational amplifiers 11,11' may no longer continue functioning as amplifiers of large amplification ratio, since too large DC voltage as mentioned above is given as input thereto.

Figure 10:
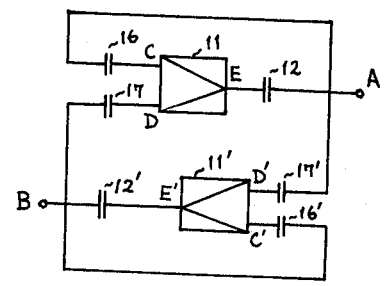
FIG. 10 is a block diagram of a different embodiment of the circuit network according to this invention, to function as a capacitor of large equivalent capacitance, which can block and can bear high DC voltage network input.

Shown in FIG. 10 is a network eliminating such drawback and thus to function as a capacitor of large equivalent capacitance, which is capable of blocking the DC voltage, wherein at least one (in the illustrated instance both of the two) of: means for linking the first input terminal C of the first operational amplifier 11 to the first network terminal A and means for linking the second input terminal D of the first operational amplifier 11 to the second network terminal B; comprises an interposed capacitor 16,17, and similarly at least one (here too, in the illustrated instance both of the two) of: means for linking the first input terminal C' of the second operational amplifier 11' to the second network terminal B and means for linking the second input terminal D' of the second operational amplifier 11' to the first network terminal A; comprises also an interposed capacitor 16',17'.

In case for instance that the high DC voltage is given only on to one of the two network terminals A,B, there is of course no need of providing the DC-blocking capacitor on the side of the other one of the network terminals. Incidentally, when the operational amplifiers 11,11' have each too high an input impedance, it might be preferable to purposely provide a proper leak resistor in order to avoid uncertain, floating DC potential as might be caused by the interposition of the DC-blocking capacitor.

As still another field of practical application of this invention, it is clear that this network will function as an inductor of large equivalent inductance, when every operational amplifier 11,11' is an operational voltage reducer with the operational amplification ratio G,G' smaller than unity, no matter in which construction of FIG. 2, 3, 4 or 5, and if every impedance element 12,12' is an inductor.

By the way, if every operational amplifier 11,11' is constructed to have adjustable operational amplification ratio G,G' for instance in response to a control voltage, it is then possible to control the equivalent impedance of this network with such control voltage. For instance, supposing a variable equivalent capacitance is required, it is of course possible to use variable capacitor such as variable capacitance diode as every element 12,12' shown in any diagram of FIG. 2 or 10, but it is also possible to obtain such variable equivalent capacitance even using every capacitor 12,12' of fixed capacitance, by using every operational amplifier 11,11' of variable operational amplification ratio as mentioned above.

I claim:
1. A circuit network to show proper equivalent impedance between a first and a second network terminals, comprising:
  (i) a first operational circuit (1), comprising:
    (a) a first operational amplifier having high input impedance, with a first input terminal linked to the first network terminal and with a second input terminal linked to the second network terminal, with input potentials expressed as $V_C$ and $V_D$, respectively, then to develop an output potential of:

$$V_E = V_C - G(V_C - V_D)$$

with G indicating the operational amplification ratio
    on an output terminal, and
    (b) a first impedance element, with one end connected to the output terminal of the first operational amplifier and with the other end connected to the first network terminal, and
  (ii) a second operational circuit, comprising:
    (c) a second operational amplifier having high input impedance, with a first input terminal linked to the second network terminal and with a second input terminal linked to the first network terminal, with input potentials expressed as $V_C'$ and $V_D'$, respectively, then to develop an output potential of:

$$V_E' = V_C' - G'(V_C' - V_D')$$

with G' indicating the operational amplification ratio
    on an output terminal, and
    (d) a second impedance element, with one end connected to the output terminal of the second operational amplifier and with the other end connected to the second network terminal, having such impedance value that the ratio of the value to the said amplification G' substantially equals the ratio of impedance value of the first impedance element to the amplification ratio G of the first operational amplifier.

2. The network of claim 1, wherein each of the operational amplifiers comprises:
(i) a first differential amplifier of amplification ratio G,G', with terminals of:
   (a) non-inverting input terminal connected to the first input terminal of the operational amplifier,
   (b) inverting input terminal connected to the second input terminal of the operational amplifier, and
   (c) output terminal, and
(ii) a second differential amplifier of amplification ratio unity, namely a simple subtractor, with terminals of:
   (d) non-inverting input terminal connected to the non-inverting input terminal of the first differential amplifier,
   (e) inverting input terminal connected to the output terminal of the first differential amplifier, and
   (f) output terminal connected to the output terminal of the operational amplifier.

3. The network of claim 1, wherein each of the operational amplifiers comprises:
(i) a differential amplifier of amplification ratio |G-1|,|G'-1| with terminals of:
   (a) inverting input terminal connected to the first input terminal of the operational amplifier if the value "G-1,""G'-1" is positive and to the second input terminal thereof if the value "G-1,""G'-1" is negative,
   (b) non-inverting input terminal connected to the second input terminal of the operational amplifier if the value "G-1,""G'-1" is positive and to the first input terminal thereof if the value "G-1,""G'-1" is negative, and
   (c) output terminal, and
(ii) a simple adder of amplification ratio unity, thus with identical input and output phases, with terminals of:
   (d) a first input terminal connected to the said one input terminal of the differential amplifier,
   (e) a second input terminal connected to the output terminal of the differential amplifier which is connected to the second input terminal of the operational amplifier, and
   (f) output terminal connected to the output terminal of the operational amplifier.

4. The network of claim 1, wherein the first and the second impedance elements are diodes, both arranged in polarity in a same direction with respect to the two network terminals, and the operational amplification ratios G,G' of the first and the second operational amplifiers are both of large value, thus providing the network to function as an idealized diode.

5. The network of claim 4, further comprising means for always keeping the first and the second operational amplifiers in active functioning region, with such construction wherein means for linking the first input terminal of the first operational amplifier (11) to the first network terminal comprises an interposed first linking element of proper resistance value rather than a simple connecting wire, and an additional diode is provided to bridge between the first input terminal and output terminal both of the first operational amplifier, as disposed in such polarity to face to the output terminal of the first operational amplifier a terminal which is opposite to terminal of the first diode as connected to the output terminal of the first operational amplifier, and as for the side of the second operational amplifier the situation is just same, thus a second linking element is interposed between the first input terminal of the second operational amplifier and the second network terminal, and another additional diode is provided to bridge between the first input terminal and output terminal both of the second operational amplifier, as disposed in such polarity to face to the output terminal of the second operational amplifier a terminal which is opposite to terminal of the second diode as connected to the output terminal of the second operational amplifier.

6. The network of claim 5, wherein the first and the second linking elements comprise a simple resistor each.

7. The network of claim 5, wherein the first and the second linking elements each comprise series connection of a follower-type amplifier of high input impedance, with input terminal connected to the pertinent network terminal a resistor with one terminal connected to output terminal of the follower-type amplifier and with the other terminal connected to the first input terminal of the pertinent operational amplifier.

8. The network of claim 3, wherein the first and the second impedance elements are diodes, both arranged in polarity in a same direction with respect to the two network terminals, and the operational amplification ratios G,G' of the first and the second operational amplifiers are both of large value, thus providing the network to function as idealized diode, further comprising means for always keeping the first and the second operational amplifiers in active functioning region, with such construction wherein means for linking the first input terminal of the first operational amplifier to the first network terminal comprises an interposed first linking element of proper resistance value rather than a simple connecting wire, and an additional diode is provided to bridge between the inverting input terminal and output terminal both of the differential amplifier constituting the first operational amplifier, as disposed in such polarity to face to the output terminal of the differential amplifier a terminal which is opposite to terminal of the first diode as connected to the output terminal of the first operational amplifier, and as for the side of the second operational amplifier the situation is just same, thus a second linking element is interposed between the first input terminal of the second operational amplifier and the second network terminal, and another additional diode is provided to bridge between the inverting input terminal and output terminal both of the differentail amplifier constituting the second operational amplifier, as disposed in such polarity to face to the output terminal of the differential amplifier a terminal which is opposite to terminal of the second diode as connected to the output terminal of the second operational amplifier.

9. The network of claim 8, wherein the first and the second linking elements comprise a simple resistor each.

10. The network of claim 8, wherein the first and the second linking elements each comprise series connection of a follower-type amplifier of high input impedance, with input terminal connected to the pertinent network terminal, and a resistor with one terminal connected to output terminal of the follower-type amplifier and with the other terminal connected to the first input terminal of the pertinent operational amplifier.

11. The network of claim 1, wherein the first and the second impedance elements are capacitors and the operational amplification ratios G,G' of the first and the second operational amplifiers are both of large value, thus providing the network to function as a capacitor showing large equivalent capacitance.

12. The network of claim 11, wherein at least one of: means for linking the first input terminal of the first operational amplifier to the first network terminal and means for linking the second input terminal of the first operational amplifier to the second network terminal; comprises an interposed capacitor, and similarly at least one of: means for linking the first input terminal of the second operational amplifier to the second network terminal and means for linking the second input terminal of the second operational amplifier to the first network terminal; comprises also an interposed capacitor, thus providing the network to function as a capacitor showing large equivalent capacitance, which can block and can bear high DC voltage network input.

13. The network of claim 1, wherein the operational amplification ratios G,G' of the first and the second operational amplifiers are both smaller than unity, thus the amplifiers are voltages reducers, and the first and the second impedance elements are inductors, thus providing the network to function as an inductor showing large equivalent inductance.

14. The network of claim 1, wherein the operational amplification ratios G,G' of the first and the second operational amplifiers are variable, whereby the network shows variable equivalent impedance.

* * * * *